(12) United States Patent
Chang et al.

(10) Patent No.: US 8,890,242 B2
(45) Date of Patent: Nov. 18, 2014

(54) CLOSED CELL TRENCHED POWER SEMICONDUCTOR STRUCTURE

(75) Inventors: Yuan-Shun Chang, Taipei (TW); Kao-Way Tu, New Taipei (TW); Yi-Yun Tsai, Penghu County (TW)

(73) Assignee: Super Group Semiconductor Co., Ltd., New Taipei (TW)

( * ) Notice: Subject to any disclaimer, the term of this patent is extended or adjusted under 35 U.S.C. 154(b) by 0 days.

(21) Appl. No.: 13/402,945

(22) Filed: Feb. 23, 2012

(65) Prior Publication Data
US 2013/0221435 A1 Aug. 29, 2013

(51) Int. Cl.
*H01L 29/78* (2006.01)

(52) U.S. Cl.
USPC ...... 257/334; 257/330; 257/331; 257/E21.41; 257/E29.262; 438/270

(58) Field of Classification Search
USPC .......................................... 257/330, 331, 334
See application file for complete search history.

(56) References Cited

U.S. PATENT DOCUMENTS 5,763,914 A * 6/1998 Hshieh et al. ................. 257/329
6,395,604 B1 * 5/2002 Kubo et al. ................... 438/270

\* cited by examiner

*Primary Examiner* — Matthew W Such
*Assistant Examiner* — David Spalla
(74) *Attorney, Agent, or Firm* — Li & Cai Intellectual Property (USA) Office

(57) ABSTRACT

A closed cell trenched power semiconductor structure is provided. The closed cell trenched power semiconductor structure has a substrate and cells. The cells are arranged on the substrate in an array. Every cell has a body and a trenched gate. The trenched gate surrounds the body. A side wall of the trenched gate facing body has a concave.

6 Claims, 6 Drawing Sheets

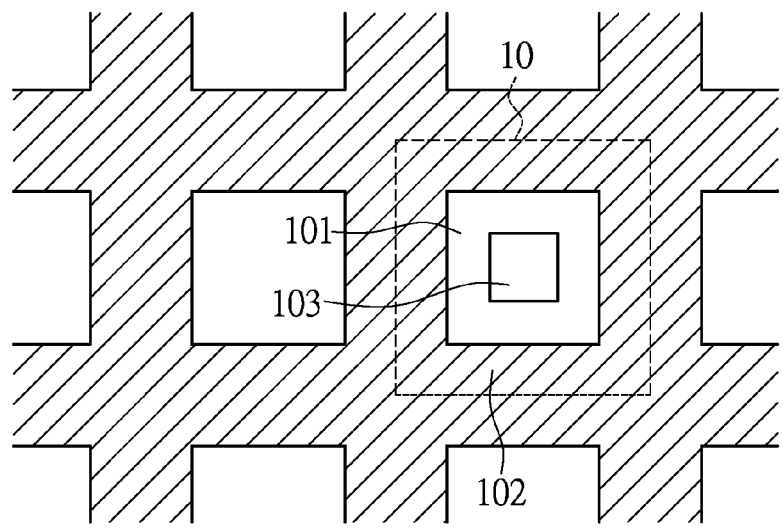
FIG. 1
PRIOR ART
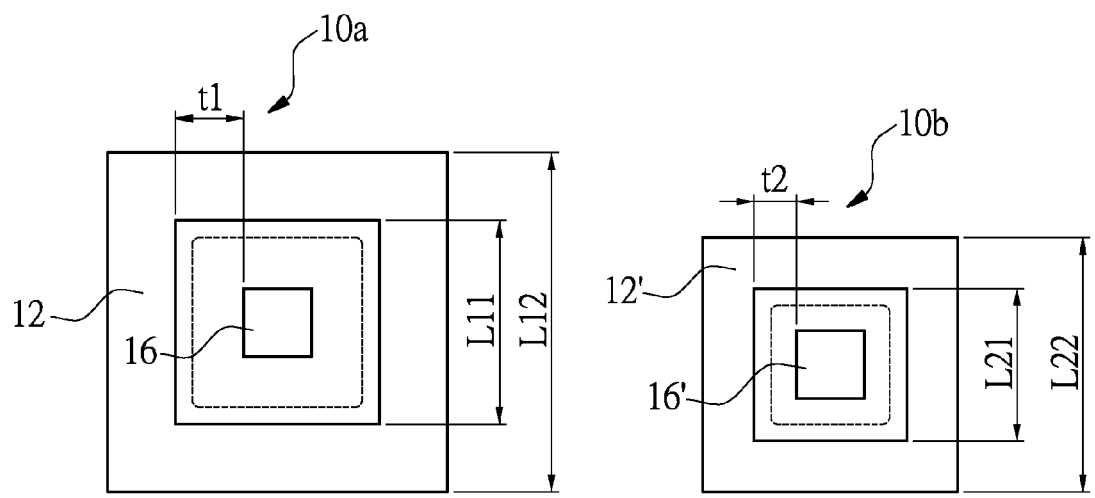
FIG. 1A
PRIOR ART
FIG. 1B
PRIOR ART

CLOSED CELL TRENCHED POWER SEMICONDUCTOR STRUCTURE

BACKGROUND OF THE INVENTION

1. Technical Field

This invention relates to a trenched power semiconductor device and a fabrication method thereof, and more particularly relates to a closed-cell trenched power semiconductor device and a fabrication method thereof.

2. Description of Related Art

The cell layout of the trenched power semiconductor devices can be sorted as closed cell and the striped cell. A major difference between the two types lies in the arrangement of the trenched gates. For the striped-cell trenched semiconductor device, the trenched gates are stripe-shaped and arranged in the body layer with substantially identical pitch. For the closed-cell trenched semiconductor device, the trenched gates are arranged as a network in the body layer and define a plurality of square areas on the body layer. In contrast with the striped-cell trenched semiconductor device, the closed-cell one with a greater channel width per unit area has the advantage of low on resistance.

FIG. 1 is a top view of a typical closed-cell trenched power semiconductor device. As shown, the trenched gate of the closed-cell trenched power semiconductor device is arranged in the body layer in array and defines a plurality of square areas 10, which is regarded as the unit cell. The source region 101 is located in the square areas 10, which adjacent to the trenched gate 102. In the middle of the square area 10 has a heavily doped region 103 acting as a conducting route between the body layer and the source metal layer.

FIG. 1A is a schematic view showing the real dimension of the unit cell of the closed-cell trenched power semiconductor device in FIG. 1. The unit of the dimension labeled in the figure is micron. The channel width Cw per unit area of the closed-cell power semiconductor device may be calculated by the function (1):

$$(L11*4)/(L12*L12)=Cw \qquad (1)$$

According to the above function (1), the value of Cw equals 2.4 micron when the length of L11 is 0.6 micron, and the length of L12 is 1 micron. As the line width shrinks, the value of the channel width per unit area may be enhanced. Take the unit cell 10b in FIG. 1B as an example. The line width of the closed-cell trenched power semiconductor device is reduced to 75% of the original line width as shown in FIG. 1A. The value of channel width Cw per unit area may be calculated by the function (2):

$$(L21*4)/(L22*L22)=Cw \qquad (2)$$

According to the above function (2), when the length of L21 is 0.45 micron and the length of L22 is 0.75 micron, the value of Cw equals 3.2 micron. Although the shrinkage of cell dimension is helpful for enhancing channel width to reduce on resistance, it has a significant drawback that the distance between the heavily doped region 16,16' at the middle of the square area and the surrounding gate structure 12,12' is also reduced. (the width t1 of the FIG. 1A is reduced to the width t2 of the FIG. 1B.) The impurities in the heavily doped region 16' may easily diffuse to the adjacent area of the gate structure 12' such that the doping concentration of the channel would be varied so as to influence the predetermined threshold voltage of the power semiconductor device.

SUMMARY OF THE INVENTION

Accordingly, it is a main object of the present invention to provide a closed-cell trenched power semiconductor device, which is capable to enhance the value of channel width per unit area without the drawback of the uncertain threshold voltage.

For achieving the above mentioned object, a closed-cell trenched power semiconductor device is provided in accordance with an embodiment of the present invention. The closed-cell trenched power semiconductor device has a base and a plurality of unit cells arrayed on the base. Each of the unit cell includes a body region and a trenched gate surrounding the body region. At least a side surface of the trenched gate facing the body region has a concave.

According to an embodiment of the closed-cell trenched power semiconductor device, the width of the concave is smaller than any opposite sides of the trenched gate.

According to an embodiment of the closed-cell trenched power semiconductor device, the unit cell is rectangular in shape.

According to an embodiment of the closed-cell trenched power semiconductor device, the trenched gate has a concave on the sidewall in respect to a short side of the unit cell.

According to an embodiment of the closed-cell trenched power semiconductor device, the trenched gate has concave on the two sidewalls in respect to the two short sides of the unit cell.

According to an embodiment of the closed-cell trenched power semiconductor device, the concave is rectangular or triangular in shape.

According to an embodiment of the closed-cell trenched power semiconductor device, the body region is H-shaped.

According to an embodiment of the closed-cell trenched power semiconductor device, the body region is U-shaped.

According to an embodiment of the closed-cell trenched power semiconductor device, the trenched gate has a protrusion at the middle of the sidewall thereof to define two concaves by the both sides of the protrusion.

According to the above mentioned trenched power semiconductor device, a fabrication method of a closed-cell trenched power semiconductor device is provided in accordance with an embodiment of the present invention. Firstly, a base is provided. Then, a trenched gate is formed on the base. The trenched gate is arranged as a network on the base to define a plurality of unit cells arrayed on the base. Each unit cell has a body region defined at the middle thereof and at least a side surface of the trenched gate within the unit cell facing the body region has a concave. Thereafter, a source doped region is formed in the body region along the trenched gate. Then, a first dielectric pattern layer is formed to cover the trenched gate and a predetermined distance away from the trenched gate so as to define a source contact window over the body region. Then, a second dielectric pattern layer is formed on the source contact window to shield the concave but leave an open to expose the body region. Thereafter, a heavily doped region is formed in the body region through the open. Next, the second dielectric pattern layer is removed and a conductive layer is formed in the source contact window.

BRIEF DESCRIPTION OF THE DRAWINGS

The present invention will now be specified with reference to its preferred embodiment illustrated in the drawings, in which:

FIG. 1 is a top view of a typical closed-cell trenched power semiconductor device.

FIG. 1A is a schematic view showing the real dimension of the unit cell of the closed-cell trenched power semiconductor device in FIG. 1.

FIG. 1B is a schematic view showing the real dimension of the unit cell of the closed-cell trenched power semiconductor device with line width shrinks.

DETAILED DESCRIPTION OF THE EXEMPLARY EMBODIMENTS

Figure 2:
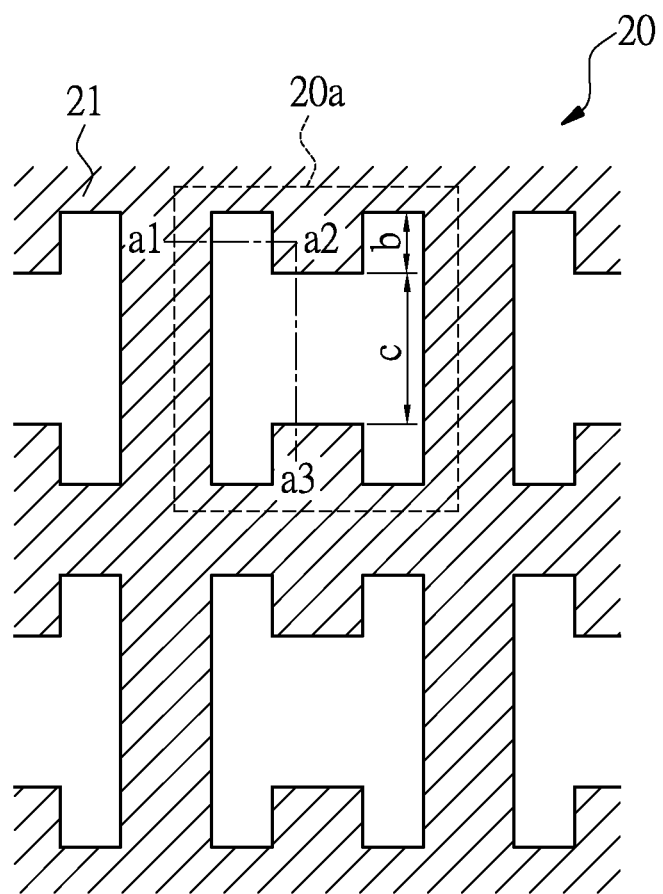
FIG. 2 is a schematic view showing a closed-cell trenched power semiconductor device in accordance to an embodiment of the present invention.

FIG. 2 is a schematic view showing a closed-cell trenched power semiconductor 20 device in accordance to an embodiment of the present invention. As shown, the closed-cell trenched power semiconductor device 20 has a base 21 and a plurality of unit cells 20a arrayed on the base 21.

Figure 2A:
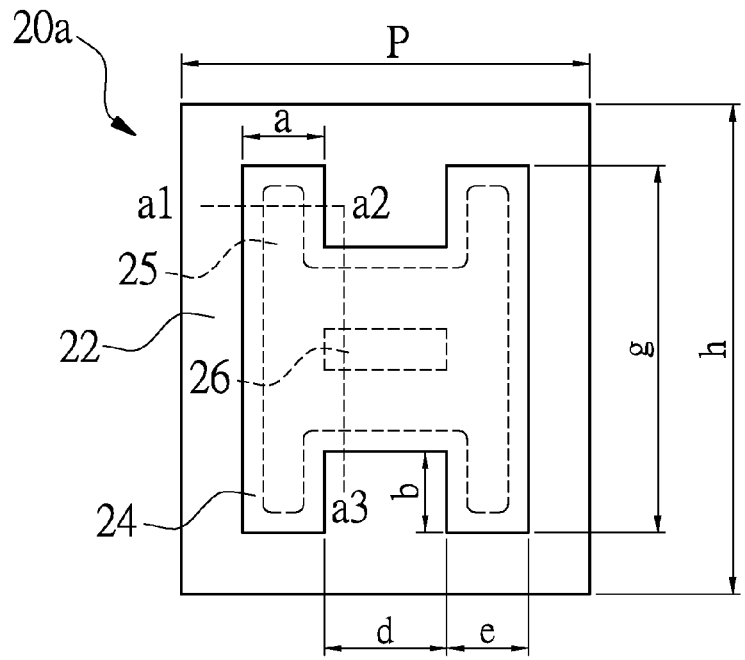
FIG. 2A is a schematic view showing the unit cell 20a of the closed-cell trenched power semiconductor device of FIG. 2.

FIG. 2A is a schematic view showing the unit cell 20a of the closed-cell trenched power semiconductor device 20 of FIG. 2. As shown, the unit cell 20a includes a body region 24 and a trenched gate 22 and is rectangular in shape. The trenched gate 22 surrounds the body region 24 and defines the shape of the body region 24. The source doped region is located in the body region 24 adjacent to the trenched gate 22, and a heavily doped region 26 is located at the middle of the body region 24. The body region 24 and the trenched gate 22 are covered by a dielectric pattern layer, which has a source contact window 25 defined therein to expose the source doped region and the heavily doped region 26. The boundary length of the body region 24 is corresponded to the channel width of the unit cell 20a of the closed-cell trenched power semiconductor device 20.

The trenched gate 22 has at least an inner sidewall and the inner sidewalls collapse inwardly to define a concave portion facing toward the body region 24. In the present embodiment, the trenched gate 22 has four rectangular concave portions. The concave portions are located at the positions in respect of the short sides of the unit cell 20a and adjacent to the long sides of the trenched gate 22 so as to define an H-shaped body region 24. However, the present invention is not so restricted. For example, the concave portions may be located at the long sides of the trenched gate 22 or asymmetrically arranged on the inner sidewalls of the trenched gate 22.

The concave portion on the trenched gate 22 is utilized for increasing the value of channel width per unit cell 20a. The depth b of the concave portion would be limited by the fabrication line width. The greater the depth b of the concave portion is, the larger the value of channel width per unit cell 20a is. However, the increasing depth b implies a smaller dimension c of the body region 24 which may result in the problem of an insufficient distance between the heavily doped region 26 and the trenched gate 22. Take the depth b of 0.2 micron, the length d of 0.3 micron, the length e of 0.2 micron, the length g of 0.9 micron, and the length h of 1.2 micron for example, in contrast with the unit cell 20a shown in FIGS. 1A and 1B, the value of channel width per unit area of the unit cell 20a in accordance with the present invention may be calculated as below function(3):

$$[(0.2*4+0.3)*2+0.9*2]/(1*1.2)=3.33 \qquad (3)$$

Figure 3:
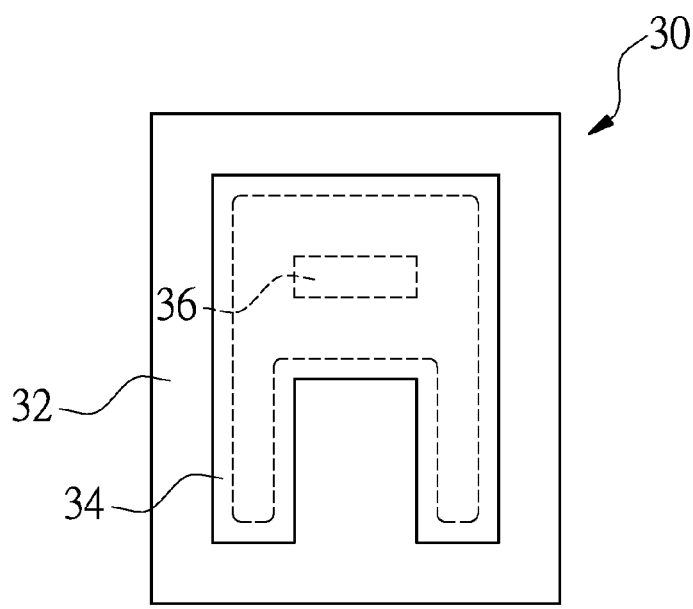
FIG. 3 is a schematic view showing a unit cell 30 of a closed-cell trenched power semiconductor in accordance with another embodiment of the present invention.
Figure 3A:
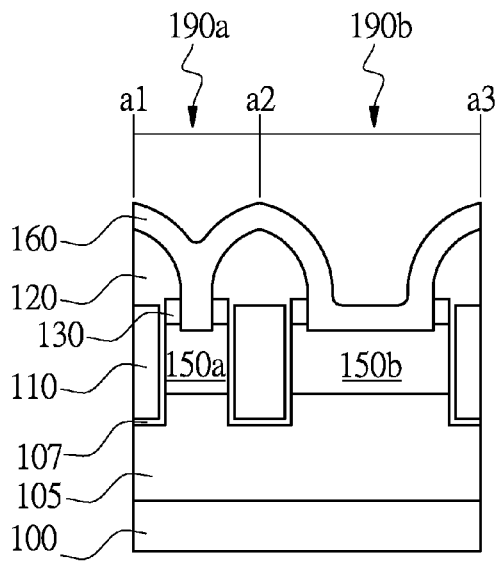
FIGS. 3A to 3C are schematic views showing the fabrication method of the closed-cell trenched power semiconductor device in accordance with an embodiment of FIG. 2.
Figure 3B:
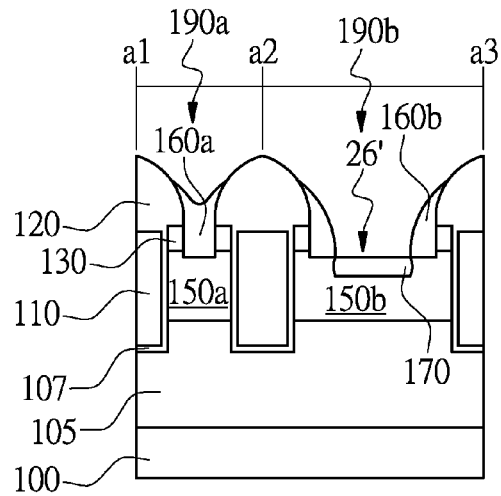
Figure 3C:
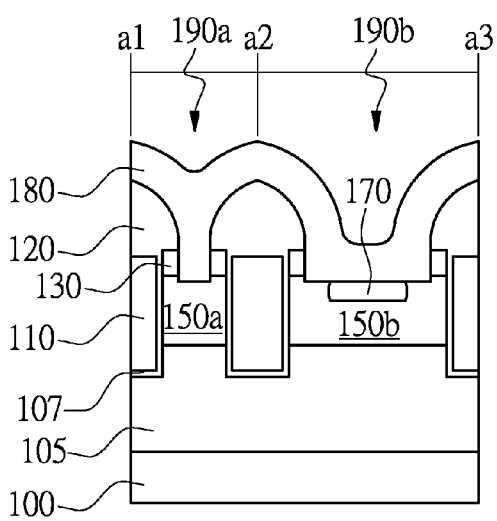

FIGS. 3A to 3C are schematic views showing the fabrication method of the closed-cell trenched power semiconductor device in accordance with an embodiment of FIG. 2. The labels a1, a2, and a3 are referring to FIG. 2A and the cross-section views along the dashed lines a1 to a2 and a2 to a3 of FIG. 2A are shown. As shown in FIG. 3A, a substrate 100 is provided, and then an epitaxial layer 105 is formed on the substrate 100. Thereafter, a body region (including 150a and 150b) is formed on the substrate 100. Then, a trenched gate, which includes a gate dielectric layer 107 and a gate polysilicon structure 110, is formed on the substrate 100.

Also referring to FIGS. 2 and 2A, the trenched gate 22 is arranged as a network on the substrate 100, which shows a plurality of unit cells 20a arrayed on the substrate 100 and defines the body region 24, which corresponded to the regions labeled as 150a and 150b in FIG. 3A, at the center of each of the unit cell 20a.

Then, a source doped region 130 is formed in the body regions 150a and 150b. Afterward, a first dielectric pattern layer 120 is formed to shield the trenched gate and the body regions 150a, 150b within a predetermined distance so as to define the source contact window. The source contact window may be divided into a first portion 190a in respect to the body region 150a and the second portion 190b in respect to the body region 150b. The width of the first portion 190a of the source contact window is smaller than that of the second portion 190b of the source contact window. Thereafter, a second dielectric pattern layer 160 is formed to cover the first portion 190a and the second portion 190b of the source contact window. Since the width of the first portion 190a is smaller than that of the second portion 190b, with the thickness of the second dielectric pattern layer 160 being properly adjusted, the thickness of the second dielectric pattern layer 160 on the bottom of the first portion 190a of the source contact window would be greater than that on the bottom of the second portion 190b of the source contact window.

Then, as shown in FIG. 3B, a portion of the second dielectric pattern layer is removed to form an open exposing a portion of the body region 150b by using anisotropic etching process. After the etching step, the portion 160a of the second dielectric pattern layer located in the first portion 190a of the source contact window still covers the whole body region 150a to prevent the formation of the heavily doped region in the body region 150a in the following steps, but the portion 160b of the second dielectric pattern layer located in the second portion 190b of the source window leaves a portion of the body region 150b exposed. Thereafter, a heavily doped region 170 is formed in the body region 150b. Finally, as shown in FIG. 3C, the remained second dielectric pattern layer 160a, 160b is removed and a conductive layer 180 is formed in the first portion 190a and the second portion 190b of the source contact window.

In the step referring to FIGS. 3B and 2A, the second dielectric pattern layer covers the concave portions on the inner sidewall of the trenched gate 22 but leave an open 26' to expose the body region 24 for the formation of the heavily doped region 26.

In the above mentioned step, the portion 160a of the second dielectric pattern layer is capable to prevent the formation of the heavily doped region in the body region 150a, which is in respect to the concave portions on the inner sidewall of the trenched gate 22. In addition, the formation of the portion 160b of the second dielectric pattern layer is capable to keep a sufficient distance between the heavily doped region 170 and the gate polysilicon structure 110 so as to prevent the impurities in the heavily doped region 170 from diffusing to the channel adjacent to the trenched gate to influence the predetermined threshold voltage of the power semiconductor device.

For achieving the above mentioned effect, the width a of the opening of the concave portion on the inner sidewall of the trenched gate 22 should be properly regulated. Since the present embodiment adopts the formation of the second dielectric pattern layer 160 to prevent the formation of the heavily doped region 26 in the body region 24 with respect to the concave portions, the width a of the opening of the concave portion should be adjusted according to the thickness of the second dielectric pattern layer so as to make sure that the thickness of the second dielectric pattern layer with respect to the concave portion is greater than that of the second dielectric pattern layer on the middle of the body region 24. It worth noting that the extending direction of the width a of the opening of the concave portion is the same as the extending direction of the short side. In the present embodiment, the width a of the opening of the concave portion should be smaller than any opposite sides c (as shown in FIG. 2) or g (as shown in FIG. 2A) of the trenched gate 22.

The shape of the body region defined by the trenched gate may be varied according to the need. FIG. 3 is a schematic view showing a unit cell 30 of a closed-cell trenched power semiconductor in accordance with another embodiment of the present invention. As shown, from the top view, the unit cell 30 has a body region 34 and a trenched gate 32 and is rectangular in shape. The trenched gate 32 has a protrusion at the middle of an inner sidewall so as to define two rectangular concave portions by the protrusion.

The body region 34 is U-shaped and can be divided into two regions, the protruding regions corresponded to the concave portions of the trenched gate 32 and the rectangular region. In addition, the heavily doped region 36 in the present embodiment is located at the middle of the rectangular region so as to prevent the impurities of the heavily doped region 36 from reaching the inner sidewall of the trenched gate 32 during the thermal fabrication steps. However, the present invention is not so restricted. Under the only limitation that a predetermined distance should be kept from the heavily doped region 36 to the trenched gate 32, the location of the heavily doped region 36 may be varied according to the need and the respective fabrication steps.

Figure 4:
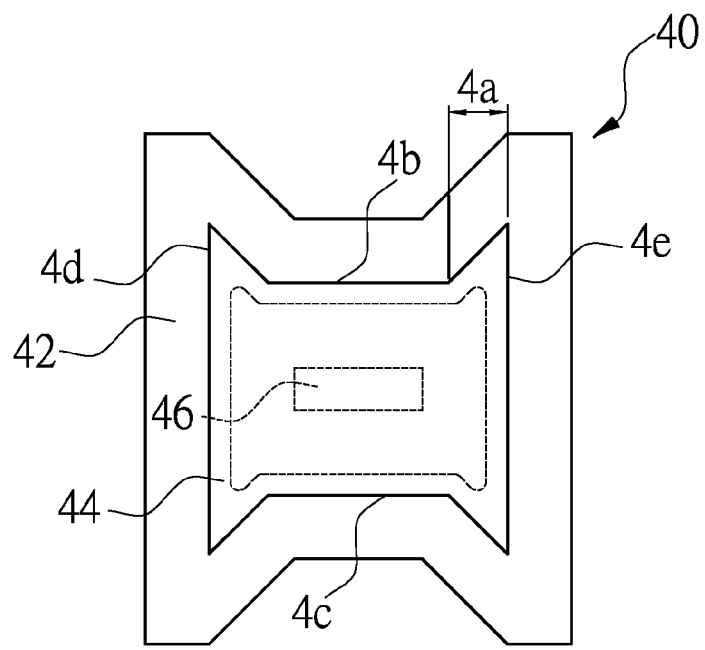
FIG. 4 is a schematic view showing a unit cell 40 of a closed-cell trenched power semiconductor device in accordance with another embodiment of the present invention.

FIG. 4 is a schematic view showing a unit cell 40 of a closed-cell trenched power semiconductor device in accordance with another embodiment of the present invention. As shown from the top view, the unit cell 40 has a body region 44 and a trenched gate 42. The trenched gate 42 has four triangular concave portions located at the four corners of the trenched gate 42. The width 4a of the opening of the concave portion is smaller than distance between the opposite sides 4b, 4c or 4d, 4e of the trenched gate 42.

Figure 4A:
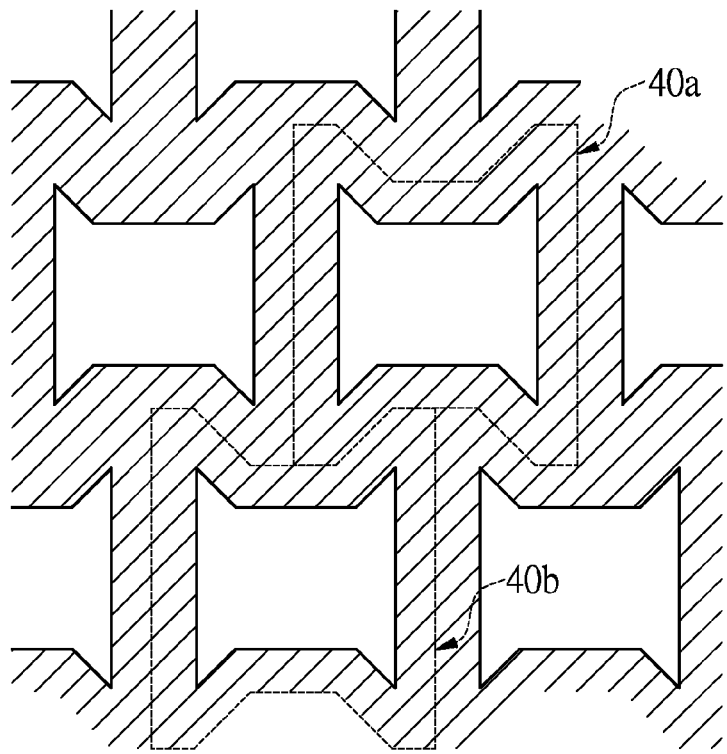
FIG. 4A is a closed-cell trenched power semiconductor device with the unit cell 40 of FIG. 4.

In the present embodiment, the overall shape of the unit cell 40 is relative to the existence of the concave portions for a better space utilization to enhance cell density. As shown in FIG. 4A, each of the unit cell rows are alternatively aligned such that the downward protruding corner of the unit cell 40a matches the upward protruding corner of the unit cell 40b in the next row.

Figure 5:
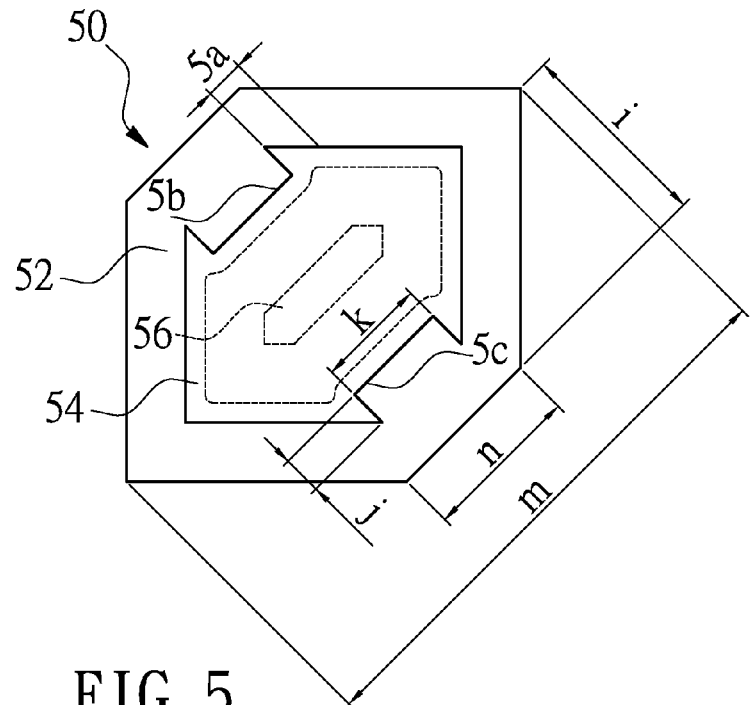
FIG. 5 is a schematic view of a unit cell 50 of a closed-cell trenched power semiconductor device in accordance with another embodiment of the present invention.

FIG. 5 is a schematic view of a unit cell 50 of a closed-cell trenched power semiconductor device in accordance with another embodiment of the present invention. As shown for the top view, the unit cell 50 has a body region 54 and a trenched gate 52. The shape of the trenched gate 52 is hexagonal. The trenched gate 52 has four triangular concave portions formed at the four obtuse corners thereof. The width 5a of the opening of the concave portion is smaller than the distance between the opposite sides 5b and 5c of the trenched gate 52. According to the layout of the unit cell 50 in accordance with the present embodiment, take the depth i of 0.5 micron, the length j of 0.1 micron, the length k of 0.3 micron, the length m of 1.4 micron, and the length n of 0.4 micron for example, the value of channel width per unit area may be calculated by the function(4):

$$[(0.5*2+0.1*2+0.3)*2]/[(1.4+0.4)*5]=3.33 \quad (4)$$

Figure 5A:
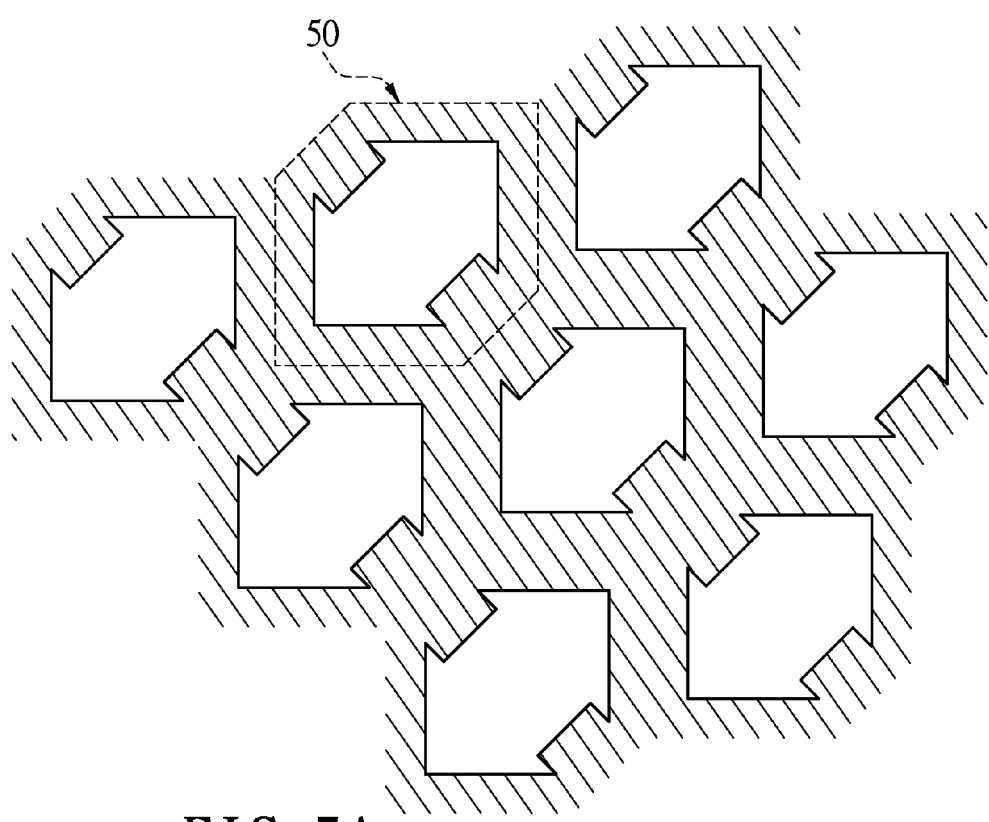
FIG. 5A is a closed-cell trenched power semiconductor device with the unit cell 50 of FIG. 5 being honeycomb arrayed on the substrate.

FIG. 5A is a closed-cell trenched power semiconductor device with the unit cell 50 of FIG. 5 being honeycomb arrayed on the substrate. As mentioned, the present embodiments adopt the concave portions on the inner sidewall of the trenched gate to enhance the value of channel width per unit area and properly adjust the width of the opening of the concave portion to prevent the formation of heavily doped region in the body region with respect to the concave portion by using the second dielectric pattern layer with uneven thickness such that the heavily doped region is only formed in the location away from the trenched gate so as to prevent the concentration of the channel closed to the trenched gate from being influenced by the impurities in the heavily doped region defined by the open in the second dielectric pattern layer.

While the preferred embodiments of the present invention have been set forth for the purpose of disclosure, modifications of the disclosed embodiments of the present invention as well as other embodiments thereof may occur to those skilled in the art. Accordingly, the appended claims are intended to cover all embodiments which do not depart from the spirit and scope of the present invention.

What is claimed is:

1. A closed-cell trenched power semiconductor device, comprising:
a base; and
a plurality of unit cells, arrayed on the base, and each of the unit cell including:
    a body region; and
    a trenched gate, surrounding the body region;
        wherein the trenched gate has at least an inner sidewall, the inner sidewall collapses inwardly to define at least a concave portion facing toward the body region.

2. The closed-cell trenched power semiconductor device of claim 1, wherein a width of an opening of the concave portion is smaller than a distance between any opposite inner sidewalls of the gate trench, wherein the extending direction of the width of the opening of the concave portion is the same as the extending direction of the short side of the unit cell.

3. The closed-cell trenched power semiconductor device of claim 1, wherein the unit cell is rectangular shaped.

4. The closed-cell trenched power semiconductor device of claim 3, wherein the inner sidewall of the trenched gate having the concave portion is with respect to a short side of the unit cell.

5. The closed-cell trenched power semiconductor device of claim 4, wherein each of the two inner sidewalls of the trenched gate with respect to the two short sides of the unit cell has the concave portion.

6. The closed-cell trenched power semiconductor device of claim 1, wherein the concave portion is rectangular or triangular in shape.

* * * * *